(12) United States Patent
Schmidt et al.

(10) Patent No.: US 11,059,994 B2
(45) Date of Patent: Jul. 13, 2021

(54) SILICONE RESIN, RELATED METHODS, AND FILM FORMED THEREWITH

(71) Applicant: DOW SILICONES CORPORATION, Midland, MI (US)

(72) Inventors: Randall G. Schmidt, Midland, MI (US); Yanhu Wei, Midland, MI (US); Shengqing Xu, Midland, MI (US)

(73) Assignee: Dow Silicones Corporation, Midland, MI (US)

(*) Notice: Subject to any disclaimer, the term of this patent is extended or adjusted under 35 U.S.C. 154(b) by 0 days.

(21) Appl. No.: 16/635,043

(22) PCT Filed: Jul. 30, 2018

(86) PCT No.: PCT/US2018/044393
§ 371 (c)(1),
(2) Date: Jan. 29, 2020

(87) PCT Pub. No.: WO2019/027908
PCT Pub. Date: Feb. 7, 2019

(65) Prior Publication Data
US 2020/0248031 A1 Aug. 6, 2020

Related U.S. Application Data

(60) Provisional application No. 62/539,029, filed on Jul. 31, 2017.

(51) Int. Cl.
*C09D 183/04* (2006.01)
*C08G 77/12* (2006.01)
*H01B 3/46* (2006.01)
*H01B 19/00* (2006.01)
*C08G 77/00* (2006.01)

(52) U.S. Cl.
CPC .......... *C09D 183/04* (2013.01); *C08G 77/12* (2013.01); *H01B 3/46* (2013.01); *H01B 19/00* (2013.01); *C08G 77/70* (2013.01)

(58) Field of Classification Search
CPC .................................................. H01B 3/46
See application file for complete search history.

(56) References Cited

U.S. PATENT DOCUMENTS

| | | | |
|---|---|---|---|
| 6,015,457 A | 1/2000 | Leung et al. | |
| 7,011,868 B2 | 3/2006 | Waldfried et al. | |
| 8,026,035 B2 * | 9/2011 | Motallebi | C08G 77/50 430/270.1 |
| 10,990,012 B2 * | 4/2021 | Fu | G03F 7/2037 |
| 2006/0110940 A1 * | 5/2006 | Seon | H01L 21/02216 438/780 |
| 2007/0015892 A1 * | 1/2007 | Nakagawa | H01L 21/02282 528/25 |
| 2008/0241748 A1 * | 10/2008 | Motallebi | G03F 7/0752 430/286.1 |
| 2008/0305611 A1 | 12/2008 | Hirota | |
| 2009/0032901 A1 | 2/2009 | Chen et al. | |
| 2010/0112321 A1 | 5/2010 | Zhu | |
| 2011/0027466 A1 | 2/2011 | Maghsoodi et al. | |
| 2012/0214006 A1 | 8/2012 | Chen et al. | |
| 2014/0004357 A1 | 1/2014 | Zhou | |
| 2014/0187733 A1 * | 7/2014 | Okawa | C09J 183/04 528/14 |
| 2015/0225508 A1 | 8/2015 | Song et al. | |

FOREIGN PATENT DOCUMENTS

| | | | |
|---|---|---|---|
| JP | H07-330908 A | | 12/1995 |
| JP | 11012542 A | * | 1/1999 |
| JP | H11-12542 A | | 1/1999 |

OTHER PUBLICATIONS

Dow Corning Corporation, Silicone Chemistry Overview, 1-11 (1997) (Year: 1997).*
E. Abrahamson et al., 13 Journal of Organic Chemistry, 275-279 (1948) (Year: 1948).*
International Search Report for PCT/US2018/044393 dated Oct. 17, 2018, 2 pages.
Volksen, Willi et al., "Low Dielectric Constant Materials", Chemical Reviews 110.1 (2010), pp. 56-110.
Machine-assisted English translation of JP H07-330908 obtained from https://worldwide.espacenet.com on Jan. 29, 2020, 16 pages.
Machine-assisted English translation of JP H11-12542 obtained from https://worldwide.espacenet.com on Jan. 29, 2020, 6 pages.

* cited by examiner

*Primary Examiner* — Alexander R Pagano
(74) *Attorney, Agent, or Firm* — Warner Norcross + Judd LLP

(57) ABSTRACT

A silicone resin is disclosed. The silicone resin is free from carbon atoms. A method of preparing the resin is additionally disclosed. This method comprises reacting a silane compound and a precursor compound, thereby preparing the silicone resin. A composition including the silicon resin and a vehicle is further disclosed. A method of preparing a film with the composition is also disclosed. This method comprises applying the composition including the silicone resin and the vehicle to a substrate to form a layer. This method also includes heating the layer to give the film.

13 Claims, No Drawings

SILICONE RESIN, RELATED METHODS, AND FILM FORMED THEREWITH

CROSS-REFERENCE TO RELATED APPLICATIONS

This application is the national stage of International Appl. No. PCT/US2018/044393 filed on 30 Jul. 2018, which claims priority to and all advantages of U.S. Patent Application No. 62/539,029 filed on 31 Jul. 2017, the contents of which are hereby incorporated by reference.

FIELD OF THE INVENTION

The present invention generally relates to a silicone resin and, more specifically, to a silicone resin free from carbon atoms, a method of preparing the same, and a method of preparing a film therewith.

DESCRIPTION OF THE RELATED ART

Silicone resins are known in the art and utilized in various end use applications. Silicone resins typically include three-dimensional networks attributable to the presence of T siloxy units ($R^0SiO_{3/2}$) and/or Q siloxy units ($SiO_{4/2}$), where $R^0$ is a substituent. Properties of silicone resins differ depending on, among other things, their cross-link densities and molar fractions of siloxy units. Increasing the cross-link density generally results in a silicone resin having greater hardness and/or rigidity. Silica, or glass, comprises primarily Q siloxy units.

T resins, or silsesquioxanes, are often utilized for spin-on-glass (SOG) applications, whereby the T resins are applied on a substrate, spun into a layer of uniform thickness, and dried and cured to give solid spin-on-glass (SOG) films. SOG films are desirable in that they may be formed from T resins in liquid form, e.g. in a solvent, and subsequently annealed to give the SOG films having properties similar to glass. Dielectric properties of the SOG films allows for many end use applications, particularly in the electronics industry.

However, SOG films are often brittle and suffer from cracking at elevated temperatures. This may be particularly problematic at certain SOG film thicknesses. Thus, thermal stability and resistance to cracking limits potential end use applications of SOG films and the T resins suitable for preparing such SOG films.

SUMMARY OF THE INVENTION

The present invention provides a silicone resin having the following general formula (I):

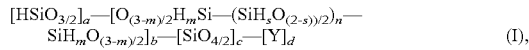
(I), wherein each Y is a polysilane moiety having from 2 to 5 Si atoms; wherein $0<a<1$; $0≤b≤0.2$; $0≤c≤0.2$; and $0≤d≤0.2$; with the proviso that $b+d>0$; $a+b+c+d=1$; m is independently 0, 1 or 2; s is independently 0, 1 or 2; and n is an integer from 0 to 3. The silicone resin is free from carbon atoms.

A method of preparing the silicone resin is also provided. The method comprises reacting a silane compound and a precursor compound, thereby preparing the silicone resin. The silane compound has at least one of the formulas: (i) $X_3Si(SiX_2)_{n'}SiX_3$, (ii) $[Si(X_2)]_{n''}$, and (iii) $(Y')_{n'}(X)_{3-n'}Si—Si(Y')_{3-m'}(X)_{m'}$; and the precursor compound has the formula $HSiX'_3$, wherein each Y' has the formula $SiX_3$, each X and each X' is an independently selected silicon-bonded hydrolysable group, each n' is an integer from 0 to 3, n'' is an integer from 3 to 5, m' is an integer from 0 to 3, and n'+m' is 1, 2, or 3 when the silane compound has formula (iii).

A composition including the silicon resin and a vehicle is further provided.

A method of forming a film is also provided. The method includes applying the composition including the silicone resin and the vehicle to a substrate to form a layer, and heating the layer to give the film.

DETAILED DESCRIPTION OF THE INVENTION

The present invention provides a silicone resin, along with related methods and end uses thereof. For example, the present invention also provides a method of preparing the silicone resin and a method of forming a film with a composition comprising the silicone resin. However, the silicone resin is not limited to end use applications involving the formation of films. For example, the silicone resin may be utilized in a curable composition, in cosmetic compositions, in personal care compositions, etc.

The silicone resin has the following general formula (I):

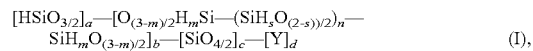
(I), wherein each Y is a polysilane moiety having from 2 to 5 Si atoms; wherein $0<a<1$; $0≤b≤0.2$; $0≤c≤0.2$; and $0≤d≤0.2$; with the proviso that $b+d>0$; $a+b+c+d=1$; m is independently 0, 1 or 2; s is independently 0, 1 or 2; and n is an integer from 0 to 3.

Notably, the silicone resin does not include any substituted or unsubstituted hydrocarbyl groups, which are typically included in conventional silicone resins. This is due to the silicone resin being free from carbon atoms. As described below, when forming films with the silicone resin (or with the composition comprising the silicone resin), the presence of carbon atoms may result in the formation of silicon carbide in the resulting film, which undesirably impacts dielectric properties of the film. For example, conventional silicone resins include silicon-carbon bonds, typically in the form of silicon-bonded organic groups, e.g. silicon-bonded methyl. Alternatively, conventional silicone resins may include silicon-carbon bonds resulting from hydrosilylation, e.g. where a bivalent hydrocarbon linking group is present between silicon atoms. However, the inventive silicone resin is free from carbon atoms, the benefits of which are described below.

As understood in the art, the silicone resin may include at least some residual hydroxyl groups, in the form of silicon-bonded hydroxyl groups, or silanol groups. In certain embodiments, the silicone resin comprises up to 3 mol % silanol groups based on the total number of silicon atoms in the silicone resin. Said differently, up to 3 mol % of all silicon atoms in the silicone resin may include a silicon-bonded hydroxyl group.

Subscripts a, b, c, and d are mole fractions and are independently selected. As such, it is to be understood that $a+b+c+d=1$. Typically, $a>b$, $a>c$, $a>d$, $a>(b+c)$, $a>(b+d)$, and $(b+d)>0$.

The moieties represented by subscripts b and d are independently selected polysilane moieties. In particular, each polysilane represented by subscript b is an independently selected linear polysilane having from 2 to 5 Si atoms. Each polysilane represented by subscript b is typically selected from disilanes, trisilanes, linear tetrasilanes, linear pentasilanes, and combinations thereof. In certain embodiments, 0<b<0.2, alternatively 0<b≤0.175, alternatively 0.01≤b≤0.15, alternatively 0.02≤b≤0.10. In specific embodiments, b is 0.02, 0.03, 0.04, 0.05, 0.06, 0.07, 0.08, or 0.09. In view of the significant figures recited herein, when b is 0.024, this correlates to b being 0.02, and so on, such that the specific values set forth above are not specifically required.

Each polysilane moiety represented by subscript d (i.e., Y) is an independently selected polysilane moiety having from 2 to 5 Si atoms. Typically, each Y is selected from branched polysilanes having 4 to 5 Si atoms, cyclic polysilanes having 3 to 5 Si atoms, and combinations thereof. In certain embodiments, Y may also be selected from branched, cyclic polysilanes having a total of 4 or 5 Si atoms. Typically, 0≤d≤0.2. In some embodiments, d is 0. In other embodiments, 0<d≤0.2, alternatively 0<d≤0.175, alternatively 0.01≤d≤0.15, alternatively 0.02≤d≤0.10. In specific embodiments, d is 0.02, 0.03, 0.04, 0.05, 0.06, 0.07, 0.08, or 0.09. In view of the significant figures recited herein, when d is 0.024, this correlates to d being 0.02, and so on, such that the specific values set forth above are not specifically required.

Typically, 0<(b+d)≤0.2. As such, in some embodiments, 0≤b≤0.2, alternatively 0≤b≤0.175, alternatively 0≤b≤0.15, alternatively 0≤b≤0.10, with the proviso that when b is 0, b<d≤0.2. Likewise, in certain embodiments, 0≤d≤0.2, alternatively 0≤d≤0.175, alternatively 0≤d≤0.15, alternatively 0≤d≤0.10, with the proviso that when d is 0, d<b≤0.2. The siloxy units indicated by subscript a are T siloxy units. Generally, the silicone resin comprises a majority of T siloxy units. In certain embodiments, a is at least 0.40, alternatively at least 0.45, alternatively at least 0.50, alternatively at least 0.55, alternatively at least 0.60, alternatively at least 0.65, alternatively at least 0.70, alternatively at least 0.75, alternatively at least 0.80, alternatively at least 0.85, alternatively at least 0.90. In specific embodiments, a=1−b, i.e., when c is 0.

The siloxy units indicated by subscript c are Q siloxy units. In certain embodiments, c is from 0 to 0.1, alternatively from 0 to 0.09, alternatively from 0 to 0.08, alternatively from 0 to 0.07, alternatively from 0 to 0.06, alternatively from 0 to 0.05, alternatively from 0.01 to 0.05, alternatively from 0.02 to 0.05, alternatively from 0.03 to 0.05, alternatively from 0.04 to 0.05.

The units indicated by subscript b may include T and/or D siloxy units, and/or silane units which do not constitute siloxy units, depending on a selection of subscripts. For example, when each m is 0 and s is 0, the units indicated by subscript b may have formula $O_{3/2}Si-(SiO_{2/2})_n-SiO_{3/2}$. In this specific embodiment, in the units indicated by subscript n, the adjacent silicon atoms are bonded directly together, e.g. in the structure below:

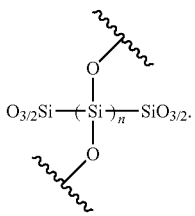

Further, subscript s in the moiety indicated by subscript b may be something other than 0. In each repeating block indicated by n, s is independently selected. As such, when n is 3, the first s is 1, the second s is 0, and the third s is 1, this moiety may have, for example, the following structure:

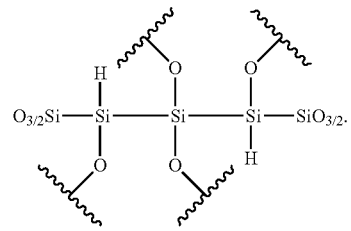

However, in specific embodiments, s and d are each 0 such that the silicone resin has the following general formula (II):

$$[HSiO_{3/2}]_a-[O_{(3-m)/2}H_mSi-(SiO_{2/2})_n-SiH_mO_{(3-m)/2}]_b-[SiO_{4/2}]_c \qquad (II),$$

wherein a, b, c, m, and n are defined above. In some such specific embodiments, m is 0, n is 0, a is 0.95, and b is 0.05, such that the silicone resin has the formula $[HSiO_{3/2}]_{0.95}[O_{3/2}Si-SiO_{3/2}]_{0.05}$. In other such specific embodiments, m is 0, n is 1, a is 0.95, and b is 0.05, such that the silicone resin has the formula $[HSiO_{3/2}]_{0.95}[O_{3/2}Si-SiO_{2/2}-SiO_{3/2}]_{0.05}$.

In various embodiments, the silicone resin has a weight average molecular weight ($M_W$) of from 300 to 40,000, alternatively from 500 to 30,500; alternatively from 1,000 to 25,000, as measured by gel permeation chromatography techniques (GPC) calibrated based on polystyrene standards.

As introduced above, a method of preparing the silicone resin is also disclosed (the "preparation method"). The preparation method comprises reacting a silane compound and a precursor compound, thereby preparing the silicone resin.

Generally, the silane compound has at least one of the formulas: (i) $X_3Si(SiX_2)_{n'}SiX_3$, (ii) $[Si(X_2)]_{n''}$, and (iii) $(Y')_{n'}(X)_{3-n'}Si-Si(Y')_{3-m'}(X)_{m'}$, wherein each Y' has the formula $SiX_3$, each X is an independently selected silicon-bonded hydrolysable group, each n' is an integer from 0 to 3, n'' is an integer from 3 to 5, and m' is an integer from 0 to 3, with the proviso that when the silane compound has formula (iii) n'+m' is 1, 2, or 3.

Typically, the silane compound has the formula $X_3Si(SiX_2)_{n'}SiX_3$, where each X is an independently selected hydrolysable group, and n' is an integer from 0 to 3.

When n' is 0, the silane compound is a disilane compound; when n' is 1, the silane compound is a trisilane compound; when n' is 2, the silane compound is a tetrasilane compound; and when n' is 3, the silane compound is a pentasilane compound. These suffixes (e.g. di-, tri-, etc.) relate to the number of silicon atoms directly bonded to one another in the silane compound.

Examples of hydrolysable groups suitable for X of the silane compound include H, halide groups, alkoxy groups, alkylamino groups, carboxy groups, alkyliminoxy groups, alkenyloxy groups, and N-alkylamido groups. Typically, the hydrolysable groups represented by X are silicon-bonded. For example, when X is H, the hydrolysable group is Si—H. Said differently, there is no linking group between the Si and the H. In some embodiments, each X is independently an alkoxy group. In specific embodiments, each X is an alkoxy group, e.g. an ethoxy group, such that the silane compound is further defined as a perethoxydi-, tri-, tetra-, or pentasilane (e.g. when n is 0, 1, 2, or 3, respectively). Accordingly, particular examples of the silane compound include hexaethoxydisilane, octaethoxytrisilanes, decaethoxytetrasilanes, and dodecaethoxypentasilanes.

Additional examples of compounds suitable for use as the silane compound include: monosubstituted disilanes, such as chlorodisilane, methoxydisilane, propoxydisilane, butoxydisilane, and the like; disubstituted disilanes, such as dichlorodisilane, dimethoxydisilane, dipropoxydisilane, dibutoxydisilane, and the like; trisubstituted disilanes, such as trichlorodisilane, trimethoxydisilane, tripropoxydisilane, tributoxydisilane, and the like; tetrasubstituted disilanes, such as tetrachlorodisilane, tetramethoxydisilane, tetrapropoxydisilane, tetrabutoxydisilane, and the like; pentasubstituted disilanes, such as pentachlorodisilane, pentamethoxydisilane, pentapropoxydisilane, pentabutoxydisilane, and the like; hexasubstituted disilanes, such as hexachlorodisilane, hexamethoxydisilane, hexapropoxydisilane, hexabutoxydisilane, and the like; as well as combinations and variations thereof. Examples of variations of such silane compounds include disilanes (e.g. when n is 0) that are: 1) substituted with two or more independently selected hydrolysable groups other than H; or 2) less than persubstituted with any one or more independently selected hydrolysable groups (e.g. H and/or the exemplary hydrolysable groups described above).

Further examples of compounds suitable for use as the silane compound include: substituted trisilanes, such as octachlorotrisilane, octamethoxytrisilane, octapropoxytrisilane, octabutoxytrisilane, and the like; substituted tetrasilanes, such as decachlorotetrasilane, decamethoxytetrasilane, decapropoxytetrasilane, decabutoxytetrasilane, and the like; substituted pentasilanes, such as dodecachloropentasilane, dodecamethoxypentasilane, dodecapropoxypentasilane, dodecabutoxypentasilane, and the like; as well as combinations and variations thereof. Examples of variations of such silane compounds include tri-, tetra-, and pentasilanes (e.g. when n is 1, 2, or 3, respectively) that are: 1) persubstituted with two or more independently selected hydrolysable groups other than H; or 2) less than persubstituted with any one or more independently selected hydrolysable groups (e.g. H and/or the exemplary hydrolysable groups described above).

In certain embodiments, the silane compound is a cyclic polysilane comprising up to 5 Si atoms. As such, examples of suitable cyclic polysilanes for use as the silane compound include cyclotrisilanes, cyclotetrasilanes, and cyclopentasilanes, comprising up to 5 Si atoms. In some embodiments, the silane compound is a cyclic polysilane having the formula $[Si(X_2)]_{n''}$, wherein each X is an independently selected silicon-bonded hydrolysable group as defined above and n'' is an integer from 3 to 5. When n'' is 3, the silane compound is a trisilane compound; when n' is 4, the silane compound is a tetrasilane compound; and when n' is 5, the silane compound is a pentasilane compound.

In some embodiments, the silane compound is a branched polysilane comprising up to 5 Si atoms. Examples of suitable branched polysilanes for use as the silane compound include tetrasilanes, and pentasilanes. In particular embodiments, the silane compound is a branched polysilane having the formula $(Y')_{n'}(X)_{3-n'}Si-Si(Y')_{3-m'}(X)_{m'}$, wherein: each Y' has the formula $SiX_3$, and each X is an independently selected silicon-bonded hydrolysable group as defined above; n' is an integer from 0 to 3; n'' is an integer from 3 to 5; m' is an integer from 0 to 3; and n'+m' is 1, 2, or 3. Examples of such branched polysilanes include: tetrasilanes having the structure:

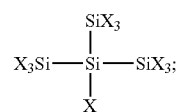

and pentasilanes having the structures:

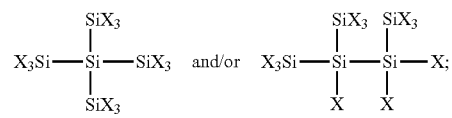

wherein each X is an independently selected silicon-bonded hydrolysable group as defined above.

The precursor compound has the formula $HSiX'_3$. Each X' is an independently selected hydrolysable group. Specific examples of hydrolysable groups suitable for X' are also set forth above relative to the hydrolysable groups suitable for X. Accordingly, each silicon-bonded hydrolysable groups represented by X' is typically independently selected from H, a halide group, an alkoxy group, an alkylamino group, a carboxy group, an alkyliminoxy group, an alkenyloxy group, or an N-alkylamido group. X may be the same as X', or X may be different from X'. Further, because the silane compound and the precursor compound each include more than one independently selected hydrolysable group represented by X or X', at least one of X and X' may be the same, whereas other of X and X' may be different from one another.

In some embodiments, each X' is independently a halide group. In specific embodiments, each X' is Cl.

Specific examples of compounds suitable for use as the precursor compound include trichlorosilane, trimethoxysilane, triethoxysilane, tetrachlorosilane, tetramethoxysilane tetraethoxysilane, dichorosilane, dimethoxysilane, diethoxysilane and combinations thereof.

In some embodiments, the silane compound may comprise a combination of any two or more particular, independently selected silane compounds, so long as each particular silane compound has the formula $X_3Si(SiX_2)_nSiX_3$, as defined above. Similarly, in these or other embodiments, the precursor compound may comprise a combination of any two or more particular, independently selected precursor compounds, so long as each particular precursor compound has the formula $HSiX'_3$, as defined above.

The silane compound and the precursor compound may be reacted in various amounts or ratios depending on desired end properties of the silicone resin. In certain embodiments, the silane compound is utilized in an amount of from greater than 0 to 30, alternatively from greater than 0 to 20, alternatively from greater than 0 to 15, alternatively from greater than 0 to 10, weight percent based on the combined weight of the silane compound and the precursor compound.

In these or other embodiments, the precursor compound is utilized in an amount of from 70 to less than 100, alternatively from 80 to less than 100, alternatively from 85 to less than 100, alternatively from 90 to less than 100, weight percent based on the combined weight of the silane compound and the precursor compound.

Typically, the silane compound and the precursor compound are reacted in the presence of a catalyst (e.g. a condensation catalyst). Examples of suitable catalysts include acids, such as carboxylic acids (e.g. formic acid, acetic acid, propionic acid, butyric acid, and/or valeric acid), sulfuric acid, and sulphonic acids (e.g. toluene sulphonic acid); bases; metal salts of organic acids, such as dibutyl tin dioctoate, iron stearate, and/or lead octoate; titanate esters, such as tetraisopropyl titanate and/or tetrabutyl titanate; chelate compounds, such as acetylacetonato titanium; transition metal catalysts, such as platinum-containing catalysts; and the like, as well as combinations thereof. In particular embodiments, the preparation method further comprises reacting the silane compound and the precursor compound in the presence of the catalyst, and the catalyst comprises a toluene sulphonic acid (e.g. TSA-$H_2O$). When utilized, the catalyst may be used in a catalytic amount, e.g. in amount of from greater than 0 to 5, alternatively 0.0001 to 1, alternatively 0.001 to 0.1 weight percent based on the combined weight of the silane compound and the precursor compound. Alternatively, the catalyst may be used in a stoichiometric amount, in excess, or in a gross excess, as will be understood in view of the conditions described below. Moreover, the catalyst may be synthesized, prepared, or otherwise obtained. In certain embodiments, the catalyst comprises TSA-$H_2O$ prepared from sulfuric acid, oleum, and toluene (e.g. such as via a procedure exemplified in the Examples below). In such embodiments, the catalyst may be utilized as a component of a catalytic system, such as a biphasic catalytic system comprising an acid phase and an organic phase. In these embodiments, the catalytic system typically comprises a phase transfer catalyst, which may be the same as or different than the catalyst.

Each of the silane compound, precursor compound, and catalyst may independently comprise, alternatively be disposed in, a carrier vehicle, such as a solvent or dispersant. The carrier vehicle, if present, may comprise, alternatively consist essentially of, alternatively consist of, a solvent. Any suitable organic or silicone carrier vehicle may be used, so long as the organic or silicone carrier vehicle does not contain a functional group that will participate in the reaction of the silane compound and precursor compound, or that will deactivate catalyst. Examples of suitable organic carrier vehicles include saturated aliphatic solvents, such as n-pentane, hexane, n-heptane, and isooctane; cycloaliphatic solvents, such as cyclopentane and cyclohexane; aromatic solvents such as benzene, toluene, xylenes, mesitylene; ethers, such as tetrahydrofuran, dioxane, ethylene glycol diethyl ether, ethylene glycol dimethyl ether; ketones, such as methylisobutyl ketone and cyclohexanone; halogen substituted alkanes, such as trichloroethane; halogenated aromatic solvents, such as bromobenzene and chlorobenzene; esters, such as propylene glycol monomethyl ether acetate, isobutyl isobutyrate, and propyl propionate; and combinations thereof. Examples of suitable silicone carrier vehicles include cyclic siloxanes, such as octamethylcyclotetrasiloxane, and decamethylcyclopentasiloxane. The carrier vehicle may comprise a single carrier vehicle, or a mixture of different carrier vehicles.

In certain embodiments, reacting the silane compound and the precursor compound consists of reacting the silane compound and the precursor compound. In these embodiments, there are no reactants other than the silane compound and the precursor compound utilized in the preparation method (although inert components, such as the carrier vehicle, may be utilized and present, which are not reactants).

Typically, reacting the silane compound and the precursor compound is carried out in a vessel or reactor. Various types of vessels or reactors can be utilized, and the preparation method is not limited to a particular one. When reacting the silane compound and the precursor compound is carried out at an elevated or reduced temperature, as described below, the vessel or reactor may be heated or cooled in any suitable manner, e.g. via a jacket, bath, etc. Furthermore, the vessel or reactor may be equipped with a stirrer, condenser, heating apparatus, cooling apparatus, addition funnel or canister, etc., e.g. based on the particular reaction components and conditions selected and utilized in reacting the silane compound and the precursor compound.

Reacting the silane compound and the precursor compound may be carried out at ambient conditions or at modified conditions. For example, the reaction may be carried out at elevated temperatures (e.g. from greater than ambient to 100° C.), a reduced temperature (e.g. less than ambient), under stirring/shear, under vacuum, under an inert atmosphere, etc. Moreover, the temperature, pressure, and other such parameters may be independently selected or modified during reacting the silane compound and the precursor compound. Any of these parameters may independently be an ambient parameter (e.g. room temperature and/or atmospheric pressure) and/or a non-ambient parameter (e.g. reduced or elevated temperature and/or reduced or elevated pressure). Any parameter may also be dynamic, modified in real time, i.e., during the inventive method, or may be static.

Typically, reacting the silane compound and the precursor compound is carried out under an anhydrous condition (i.e., lacking water) and/or under an inert atmosphere, but may be modified to incorporate other conditions. The inert atmosphere typically comprises, alternatively consists essentially of, gaseous nitrogen, helium, argon, or a mixture of any two or more thereof.

Reacting the silane compound and the precursor compound is also typically carried out at ambient pressure (e.g. atmospheric pressure) and reduced to ambient temperatures (e.g. from 18-25° C.). However, an elevated pressure (e.g. via positive pressure of an inert gas) and/or an elevated temperature (e.g. greater than ambient) may also be used. As understood in the art, reacting the silane compound and the precursor compound will generally be exothermic, and thus may influence the temperature of the reaction.

Reacting the silane compound and the precursor compound comprises combining the silane compound, the precursor compound, and the catalyst. As such, agitation (e.g. stirring) is typically utilized during the reaction. The agitating may enhance mixing and contacting together of the silane compound, the precursor compound, and/or the catalyst, including in a reaction mixture thereof. However, such combining and/or contacting may independently be utilized via other conditions, with or without the agitating.

The silane compound, the precursor compound, and the catalyst may be added to the vessel or reactor in any order or combination. In certain embodiments, the silane compound and the precursor compound are combined together in the carrier vehicle, and subsequently combined with the catalyst in the vessel or reactor. In these or other embodiments, the catalyst is added to the vessel or reactor prior to the silane compound and the precursor compound.

In some embodiments, the silane compound and the precursor compound are reacted in the presence of a reaction vehicle. Like the carrier vehicle, the reaction vehicle is independently selected, and may be the same as or different from any particular carrier vehicle utilized. The reaction vehicle comprises an organic solvent, which is typically selected from the organic solvents described above with respect to the carrier vehicle. The reaction vehicle may be added to the reactor as a discrete component, formed in the reactor from a combination of the carrier vehicle(s), or a combination thereof. As such, the reaction vehicle may comprise, alternatively consist of, a combination of any particular carrier vehicle(s) used. In these or other embodiments, the reaction vehicle comprises a component immiscible with any organic solvent(s) present in the reaction vehicle and the carrier vehicle. As such, the reaction may be carried out as a dual phase or single-phase system. In some such instances, the reaction vehicle comprises an acid component, such as a mixture of sulfuric acid and oleum.

Reacting the silane compound and a precursor compound may be performed for any length of time, which is typically selected based on factors such as the temperature utilized, the type and amount reactants utilized, the type and amount of catalyst utilized, etc. Typically, the reaction time is from 1 to 48 hours, such as from 4 to 20 hours. In particular embodiments, the reaction time is from 2 to 48, alternatively from 3 to 40, alternatively from 4 to 30, alternatively from 4 to 20, alternatively from 5 to 15, alternatively from 15 to 25, hours.

The silicone resin is typically formed in a reaction mixture, and the preparation method may further comprise isolating the silicone resin from the reaction mixture. In such embodiments, any suitable technique for isolation may be utilized. Examples of suitable isolation techniques include decanting, distilling, evaporating, extracting, filtering, freeze drying, gas chromatography, ion exchange chromatography, partitioning, phase separating, reverse phase liquid chromatography, stripping, volatilizing, and washing. It is to be appreciated that isolating may include, and thus may be referred to as, purifying the silicone resin. As used herein, isolating the silicone resin is typically defined as increasing the relative concentration of the silicone resin as compared to other compounds in combination therewith. As such, as is understood in the art, isolating/purifying may comprise removing the other compounds from such a combination (i.e., decreasing the amount of impurities combined with the silicone resin) and/or removing the silicone resin itself from the combination. Any combination and/or sequence of isolation techniques may be used. In some embodiments, isolating the silicone resin comprises phase partitioning the reaction mixture into phases, with one phase comprising the silicone resin. In these embodiments, isolating the silicone resin further comprises separating the one phase from the phases, drying the one phase (e.g. over anhydrous $Na_2SO_4$), and filtering the dried one phase to give a solution comprising the silicone resin. In these or other embodiments, isolating the silicone resin further comprises concentrating the solution comprising the silicone resin via solvent distillation (e.g. via rotary evaporator) to give the silicone resin.

As introduced above, a composition comprising the silicone resin is also disclosed. The composition comprises the silicone resin and a vehicle.

The term "vehicle" means a material acting as a carrier, hosting medium, or solvent for another material (e.g. the silicone resin), which may or may not be soluble therein. The vehicle is not limited, and is generally selected based on an ability to carry, alternatively partially solubilize, alternatively fully solubilize the silicone resin and/or any optional components of the composition, such as those described below. Accordingly, the vehicle may be a liquid, and is typically a carrier or solvent. In some embodiments, the vehicle reduces a viscosity of the composition, such that the composition may be utilized in a wet-form application. In these or other embodiments, the vehicle fully solubilizes the silicone resin, such that the composition is a solution. In certain embodiments, the vehicle is selected such that the composition is an emulsion.

Typically, the vehicle comprises, alternatively consists essentially of, alternatively consists of, a solvent. Examples of suitable solvents for use in or as the vehicle include aqueous solvents (e.g. water, and solvents soluble in and/or miscible with water) and organic solvents. Examples of suitable organic solvents include: saturated aliphatic hydrocarbons, such as pentanes, hexanes, heptanes, octanes, nonanes, dodecanes, tetradecanes, and hexadecanes; cycloaliphatic hydrocarbons, such as cyclopentane, dipentenes, and cyclohexane; aromatic and halogenated aromatic hydrocarbons, such as benzene, toluene, xylenes, mesitylene, bromobenzenes, and chlorobenzenes; hydrocarbons; alcohols, such as methanol, ethanol, propanols, butanols, heptanols, octanols, butanediols, catechol, terpineol, hydroquinone, isooctyl alcohols, and tetrahydrofurfuryl alcohol; ketones, such as methyl isobutyl ketone and 2,5-hexanedione; ethers, such as butyl ethers, hexyl ethers, phenyl and diphenyl ethers, cyclic ethers (e.g. tetrahydrofuran, dioxane, etc.), and amyl ethers (e.g. diamyl ether); glycols and glycol ethers, such as propylene glycols, triethylene glycols, ethylene glycols, diethylene glycols, propylene glycol methyl ether, dipropylene glycol methyl ether, propylene glycol n-propyl ether, trimethylene glycol, triethylene glycol dimethyl ether, ethylene glycol dibutyl ether, ethylene glycol monophenyl ether, diethylene glycol monomethyl ether, diethylene glycol monoethyl ether, diethylene glycol diethyl ether, diethylene glycol dibutyl ether, propylene glycol monophenyl ether, ethylene glycol monobenzyl ether, and ethylene glycol n-butyl ether; esters, oxylates, and acetates, such as gamma-butyrolactone, diethyl oxalate, dibutyl oxalate, propylene carbonate, butyl esters (e.g. lactic acid butyl ester), diethylene glycol monomethyl ether acetate, diethylene glycol monoethyl ether acetate, dipropylene glycol monomethyl ether acetate, 2-butoxyethanol acetate, and diethylene glycol monobutyl ether acetate; halogenated alkanes, such as trichloroethanes, dichloromethane, and chloroform; siloxanes, such as hexamethyldisiloxanes, octamethyldisiloxanes, and dimethylpolysiloxanes; other solvents, such as white spirits, mineral spirits, naphtha, kerosene, dimethyl sulfoxide, dimethyl formamide, acetonitrile, d-limonene, alpha-terpineol, tetrahydropyran-2-methanol, N-methylpyrrolidone, and sulfolane; derivatives and/or variations of the foregoing; and combinations thereof. Any of these vehicles may be referred to as solvents even if not fully solubilizing the silicone resin, although the silicone resin typically solubilizes in suitable carriers such that the carrier may be a solvent.

In particular embodiments, the vehicle comprises methyl isobutyl ketone, propylene glycol methyl ether acetate, dipropylene glycol methyl ether acetate, ethylene glycol methyl ether actate, diethylene glycol methyl ether acetate, diethylene glycol dimethyl ether, toluene, xylene, or a combination thereof.

The vehicle is generally selected to dissolve, disperse, solubilize, and/or otherwise carry the silicone resin as desired for a particular end use application of the composition, such as an end use described below. Additionally, in some embodiments the vehicle is selected to formulate the composition as an emulsion, or to formulate the composition such that an emulsion can be formed therefrom. As such, any amount of the vehicle may be used, and the vehicle utilized may itself comprise any amount of a particular solvent or combination of solvents. For example, in some embodiments, the vehicle is present in an amount of 20 to 99.9, alternatively from 70 to 99, wt. % based on the total weight of the composition.

Typically, the composition is formulated on a basis of a relative amount of the silicone resin in the composition, which may vary (e.g. depending on a desired end use of the composition). For example, in various embodiments, the composition comprises the silicone resin in an amount of from 1 to 90, alternatively from 5 to 75, alternatively from 10 to 60, alternatively from 15 to 55, alternatively from 20 to 50, alternatively from 10 to 30, alternatively from 30 to 50, alternatively 8±2, alternatively 10±2, alternatively 12±2, alternatively 14±2, alternatively 16±2, alternatively 18±2, alternatively 20±2, alternatively 25±2, alternatively 30±2, alternatively 35±2, alternatively 40±2, alternatively 45±2, alternatively 50±2, alternatively 55±2, alternatively 60±2, alternatively 65±2, wt. % based on total weight of the composition.

The composition may be formed by any technique. In some embodiments forming the composition comprises combining the silicone resin and the vehicle. In certain embodiments, forming the composition comprises solvent-exchanging the silicone resin isolated from the preparation method with the vehicle. As will be understood in view of the description below, in particular embodiments, forming the composition comprises combining the silicone resin, the vehicle, and one or more additive.

As introduced above, the composition is not limited, and may be utilized for any end use application involving the silicone resin. For example, the composition of the present disclosure is suitable for use in, as, or in a formation of, films and coatings (e.g. films and coatings having excellent heat resistance, etching resistance, weatherability, dielectric properties, and/or water repellency), paints, thermoplastics, thermosets, rubbers, fibers, adhesives, emulsions, personal care compositions, home care compositions, and the like, and combinations thereof (e.g. an emulsion for use in or as a personal care composition). The composition may include any additional additives or components based on the desired use thereof.

The composition may be used in the formation of films and/or coatings on substrates (e.g. electronic substrates), as will be understood in view of the present disclosure. For example, the composition may be utilized in a formation of silicon-based devices and/or gallium arsenide-based devices, such as those intended for use in the manufacture of a semiconductor component. Particular examples of such devices and/or components include focal plane arrays, opto-electronic devices, photovoltaic cells, optical devices, transistor-like devices, 3-D devices, silicon-on-insulator devices, super lattice devices, flat panel displays, and the like. The composition may also be used for shallow-trench isolation (STI) and/or inter-layer dielectric (ILD) gap filling. In certain embodiments, the composition may be utilized in a formation of a protective film, e.g. for anti-corrosion, anti-stain, and/or anti-stick applications.

The composition may also be used as, or formulated into, a personal care product. The personal care product may be in the form of a cream, a gel, a powder, a paste, or a freely pourable liquid. Generally, such products can be prepared at room temperature if no solid materials at room temperature are presents in the composition, or a personal care composition formed therefrom, using simple propeller mixers, Brookfield counter-rotating mixers, or homogenizing mixers. No special equipment or processing conditions are typically required. Depending on the form and/or type of personal care product made, the method of formulation will be different, but such methods are well understood in the art and may be adapted for use with the present composition and silicone resin, in view of the disclosure herein.

With respect to a portion of the body to which the personal care product is applied, the personal care product may be functional, cosmetic, therapeutic, or some combination thereof. Examples of such personal care products include antiperspirants and deodorants; skin care creams and lotions; moisturizers; facial treatments, such as acne or wrinkle removers; personal and facial cleansers; bath oils; perfumes and colognes; sachets; sunscreens; pre-shave and after-shave lotions, soaps, and lathers; hair shampoos, conditioners, colorants, colorant fixatives, relaxants, sprays, mousses, gels, permanents, and depilatories; cuticle coats; make-ups, such as color cosmetics, foundations, concealers, blushes, lipsticks, eyeliners, and mascara; oil and color cosmetic removers and powders; medicament creams, pastes, and sprays; dental hygienics; antibiotics; healing promotives; nutritives; and the like, each of which may be preventative and/or therapeutic. In general, each personal care product is formulated with the composition comprising the silicone resin and the vehicle, where the vehicle is selected to permit application of the personal care product in conventional forms, including liquids, rinses, lotions, creams, pastes, gels, foams, mousses, ointments, sprays, aerosols, soaps, sticks, soft solids, solid gels, and gels.

As introduced above, the composition comprising the silicone resin and the vehicle is generally formulated on a basis of a particular end use application. For example, when intended for use in forming a spin-on-glass (SOG) film (e.g. via a film preparation method described below), the composition is typically formulated to be substantially free from, alternatively free from, components other than the silicone resin and the vehicle (i.e., additives). As such, the composition may be free from, alternatively substantially free from, additives. However, the composition may comprise any additive suitable for use in the composition (i.e., with the silicone resin).

General examples of suitable additives include free radical initiators, Lewis and/or Bronsted acid and/or base generators, photo-acid and thermal-acid generators, photo-base and thermal-base generators, fillers, viscosity modifiers, foam control agents, anti-freeze agents, biocides, additional silicones, antioxidants, detergents, cleansing agents, colorants, conditioning agents, deposition agents, electrolytes, emollients, oils, exfoliating agents, foam boosters, fragrances, humectants, occlusive agents, pediculicides, pH control agents, pigments, preservatives, solvents, stabilizers, sun-screening agents, suspending agents, tanning agents, surfactants, thickeners, vitamins, botanicals, fragrances, waxes, rheology-modifiers, anti-dandruff agents, anti-acne agents, wound healing-promotion agents.

Specific examples of additives may include benzoyl peroxide, dicumyl peroxide, azobisisobutyronitrile, blocked dodecylbenzene sulfonic acids, sulfonyldiazomethane acid generators, onium salt generators and oxime sulfonate acid generators, phosphonium salt generators, sulfonium salt generators, iodonium salt generators, iminosulfonate generators, oximesulfonate generators, disulfone generators, and o-nitrobenzyl sulfonate generators.

Some specific examples of suitable additives include non-hydrated, partially hydrated, or hydrated halides (e.g. fluorides, chlorides, bromides, and iodides), carbonates, hydroxides, phosphates, hydrogen phosphates, nitrates, oxides (e.g. mono-, di-, tri-, tetra-, pent-, etc.), sulphates, hydroxides, mono- and disulfides, salts, silicates, zeolites, stannates, and borates of titanium, aluminum, zinc, beryllium, chromium, iron, magnesium, calcium, sodium, potassium, barium, molybdenum, and antimony, and combinations, variations, and derivatives thereof. Other specific examples of suitable additives include mica; kaolin; lithopone; boric acid; silicas, including fumed silica, fused silica, precipitated silica, quartz, sand, silica gels, and silica-carbon black composites; rice hull ash; ceramic and glass beads; metal powders and flakes of aluminum, bronze, copper, gold, molybdenum, nickel, silver, stainless steel, and tungsten; barium titanate; functionalized carbon nanotubes; fly ash; slate flour; bentonite; clay; talc; anthracite; apatite; attapulgite; boron nitride; cristobalite; diatomaceous earth; dolomite; ferrite; feldspar; graphite; calcined kaolin; perlite; pumice; pyrophyllite; sepiolite; and wollastonite; fibers, such as natural fibers (e.g. wood flour, wood fibers, cotton fibers, cellulosic fibers, wheat straw, hemp, flax, kenaf, kapok, jute, ramie, sisal, henequen, corn fibers, coir, nut shells, and rice hulls) and synthetic fibers (e.g. comprising carbon, polyester, aramid, nylon, glass, and/or combinations thereof); organic fillers, such as lignin, starch, cellulose and cellulose-containing products, plastic microspheres (e.g. of polytetrafluoroethylenes and/or polyethylenes), and solid organic pigments (e.g. those incorporating azo, indigoid, triphenylmethane, anthraquinone, hydroquinone, and/or xanthine, dyes); and combinations thereof.

As introduced above, the present disclosure also provides a method of forming a film with the silicone resin ("film preparation method").

As introduced above, conventional silicone resins, particularly those for SOG films, utilize $T^H$ siloxy (—$HSiO_{3/2}$) or carbon-containing siloxy units to form silica ($SiO_2$) films. For example, carbon-containing siloxy units may comprise $T^{Me}$, $T^{Ph}$, or disilane (-(alkyl)$_2$Si—Si(alkyl)$_2$-) groups. In particular, these conventional resins are used in conventional methods that utilize high-temperature annealing. However, high-temperature annealing oxidizes the $T^H$ siloxy units of such conventional resins to silanol groups, which must then be further condensed together to form $SiO_2$ structures. Such condensations release $H_2O$ as a byproduct. As such, while such conventional oxidation results in a theoretical ceramic yield of 113% via the incorporation of O atoms, the release of $H_2O$ and the stresses associated with a large change in density (e.g. from 1.6 to near 2.2 g/cm3) during the high-temperature annealing leads to problems of high film shrinkage, high wet etch rates (WER), and structural stress. Similarly, high-temperature annealing oxidizes the alkyl groups off the carbon-containing disilane groups (e.g. of formula -(alkyl)$_2$Si—Si(alkyl)$_2$-), thereby producing organic byproducts such as methanol, formaldehyde, etc., and providing a theoretical ceramic yield of 102%, and problems of high film shrinkage, high wet etch rates (WER), and structural stress (e.g. voids, cracks, and other defects). Voids, cracks, and other defects in turn create inhomogeneity in the films, which may adversely affect performance (e.g. as a dielectric material).

As introduced above, the film preparation method comprises applying the composition comprising the silicone resin to a substrate to give a layer, and heating the layer to give the film.

The present film preparation method provides many advantages over conventional processes, such as an increased theoretical ceramic yield, a reduced film shrinkage, a reduced WER, an increased weight gain, an increased silica film density, a decreased by-product emission, a decreased structural stress formation, and combinations thereof. As will be understood from the description herein, the layer is formed from the composition comprising the silicone resin, which comprises carbon-free disilane (i.e., Si—Si) and/or trisilane (i.e., Si—Si—Si) and/or tetrasilane (i.e., Si—Si—Si—Si) and/or pentasilane (i.e., Si—Si—Si— Si—Si) functionality derived from the silane compound used to prepare the silicone resin. Without wishing to be bound by theory, it is believed that preparing and heating the layer in accordance with the preparation method results in an insertion of oxygen (e.g. oxidatively) into the disilane and/or trisilane Si—Si bonds, thereby forming Si—O—Si moieties and siloxane bonds. Said differently, preparing the film according to the preparation method comprises transforming silicon-silicon bonds in the silicone resin into siloxane bonds, thereby forming a silica ($SiO_2$) film from the silicone resin without generating byproducts or losing weight. This may be referred to as oxygen-insertion, which increases a weight of the film, as opposed to a conventional reduction of a weight of conventional films (e.g. from condensation and/or degradation by-products being driven off during the conventional methods). Simply stated, the silane compound, once incorporated into the silicone resin, ultimately forms Q siloxy units ($SiO_2$ or $SiO_{4/2}$) in the film. Furthermore, the theoretical ceramic yield of the film preparation method is improved.

The film preparation method comprises applying the composition comprising the silicone resin to the substrate to give a layer.

The substrate is not limited, and may be any substrate suitable for use in the film preparation method (i.e., resilient and/or resistant to degradation and/or deformation to the method parameters described below). The substrate may be rigid or flexible.

Examples of suitable rigid substrates include inorganic materials, such as glass plates (e.g. comprising an inorganic layer), ceramics, sapphire, and silicon wafers. Silicon wafers may comprise monocrystalline and/or polycrystalline silicon, and may be free from, alternatively may comprise, silicon carbide, silicon oxide, silicon nitride, silicon carbonitride, silicon oxycarbonitride, sapphire, gallium nitride, and/or gallium arsenide (collectively, "dopants"). Such dopants may compose a part of the silicon wafer, such as part of a layer disposed on the silicon wafer. Such a layer may be applied, deposited, or otherwise built on the silicon wafer using any suitable method such as chemical vapor deposition, which may be plasma enhanced. Such substrates may be synthesized, prepared, or otherwise obtained, and many such substrates are commercially available.

Examples of flexible substrates include those comprising various silicone or organic polymers, which may be selected, e.g. on a basis of transparency, refractive index, heat resistance, and/or and durability. Some examples of suitable flexible substrates include those comprising polyolefins (e.g. polyethylene, polypropylene, etc.), polyesters (e.g. poly(ethylene terephthalate), poly(ethylene naphthalate), etc.), polyamides (e.g. nylon 6, nylon 6,6, etc.), polystyrenes, polyvinyl chlorides, polyimides, polycarbonates, polynorbornenes, polyurethanes, polyvinyl alcohols, (e.g. poly(ethylene vinyl alcohol), polyacrylics, celluloses (e.g. triacetylcellulose, diacetylcellulose, cellophane, etc.), or derivatives, variations, interpolymers, and/or copolymers thereof. The flexible substrate may also be reinforced, e.g. with fillers and/or fibers, such as with the fillers and fibers described above with regard to additives for use in the composition.

Particular examples of suitable substrates include device wafers (e.g. semiconductor device wafers), such as gallium arsenide wafers, silicon (Si) wafers, silicon carbide (SiC) wafers, Si wafers having an silicon oxide layer disposed thereon, and Si wafers having a SiN layer disposed thereon. In certain embodiments, the substrate comprises a component of an electronic device. In such embodiments, the film is typically further defied as a dielectric film and/or a spin-on-glass film comprising silica.

Applying the composition comprising the silicone resin to the substrate may comprise any suitable application technique. Typically, the composition is applied in wet form via a wet coating technique. As such, in certain embodiments, the silicone resin is applied via i) spin coating; ii) brush coating; iii) drop coating; iv) spray coating; v) dip coating; vi) roll coating; vii) flow coating; viii) slot coating; ix) gravure coating; or x) a combination of any of i) to ix).

In certain embodiments, the vehicle is removed from the composition after applying the composition to the substrate to give the layer. As used herein with regard to the film preparation method, the term "removal" of the vehicle is used to describe evaporating (e.g. actively and/or passively) or otherwise driving off the solvent of the vehicle from the composition on the substrate. As such, removing the vehicle generally comprises depositing the silicone resin on the substrate to give the layer on the substrate (collectively, referred to as the "layered substrate" herein). Any suitable technique for removing the vehicle may be used, such as simple air drying by exposure to an ambient environment, the application of a vacuum, the application of heat, or a combination of two or more of the foregoing techniques. Typically, removal of the vehicle comprises driving off greater than 70, alternatively greater than 80, alternatively greater than 90, alternatively greater than 95, alternatively greater than 98, wt. % solvent, on a basis of the total wt. % of the solvent present in the composition as applied to the substrate.

In specific embodiments, the silicone resin is applied via spin coating. In these embodiments, the composition is dispensed on the substrate to give a wet deposit. The wet deposit and substrate are then spun (i.e., spin coated) for a period of time to give the layer. Typically, spinning the substrate and the wet deposit drives off the solvent from the composition, thus removing the vehicle and depositing the silicone resin on the substrate to give the layer, thereby forming the layered substrate. The spin coating may be performed using any conditions (e.g. any spin speed, spin time, etc.), which are typically selected to obtain a desired thickness of the layer. Moreover, the spin speed and spin time may be static or dynamic. For example, the spin speed and/or spin time may be adjusted (e.g. increased or decreased) during the spin coating to obtain a particular thickness of the layer on the substrate. In some embodiments, the maximum spin speed may be from 400 to 5000, alternatively from 600 to 4000, alternatively from 800 to 3000, alternatively from 1000 to 2000, alternatively from 1000 to 1,600, revolutions per minute (rpm). In these or other embodiments, the spin time may be from 0.5 seconds (s) to 30 minutes (min), alternatively from 1 s to 25 min, alternatively from 10 s to 20 min, alternatively from 30 s to 20 min, alternatively from 1 to 15 min.

As introduced above, the film preparation method further comprises heating the layer to give the film.

More specifically, heating the layer comprises subjecting the layered substrate to an elevated temperature, thereby annealing and/or curing the silicone resin and giving the film. Any method of heating may be used. For example, the heating may comprise placing and heating the layered substrate in a quartz tube furnace, in a convection oven, or on a hot plate.

The elevated temperature is selected to cure/anneal the silicone resin, as described above. As such, the elevated temperature may be any temperature suitable for curing/annealing the silicone resin, and is generally selected based on the particular silicone resin, substrate, vehicle, etc. used to prepare the layered substrate. In certain embodiments, the elevated temperature is from 150 to 1200, alternatively from 200 to 1100, alternatively from 300 to 1000, alternatively from 300 to 900, alternatively from 350 to 800° C. In some embodiments, the elevated temperature is from 400 to 600° C.

The heating may comprise static or dynamic heating, or a heating protocol comprising both static and dynamic heating steps. For example, the heating may comprise a low-temperature step utilizing a temperature high enough to removing the vehicle, as described above, but below a temperature needed to give the film (i.e., cure the silicone resin). Such a low-temperature step may be utilized in the method in place of, or in conjunction with, removing the vehicle to give the layer on the film. For example, the film preparation method may comprise heating the spinned layer to form the film on the substrate. Such a film may be referred to as a spin-on-glass (SOG) film. As introduced above, the spinned layer is typically formed on the substrate wet. As such, the spinned layer may be heated at the low-temperature step (e.g. to further remove any vehicle from the spinned layer) prior to heating the spinned layer at the elevated temperature to give the SOG film.

In certain embodiments, the heating comprises heating the layer to a first elevated temperature, and subsequently to a second elevated temperature that is higher than the first elevated temperature. The first elevated temperature may be used to initiate structural changes within the silicone resin of the layer, prior to annealing and/or curing the silicone resin via heating to the second elevated temperature. In such embodiments, the first and second elevated temperatures are independently selected, and typically fall within the temperature ranges described above with regard to the elevated temperature. In some of these embodiments, the first elevated temperature is from 300 to 500° C., and the second elevated temperature is from 500 to 700° C. In these or other embodiments, the heating further comprises subjecting the layer to the low-temperature step, which is from 100 to 200° C. and utilized before the first elevated temperature. The heating may comprise using any number of elevated temperatures.

The layer may be heated for any length of time. The particular time of heating utilized may vary, and is generally selected based on the particular components used to prepare the layered substrate, the thickness of the layer, etc. Moreover, the time of heating at each temperature is independently selected, and may be the same as or different than any other time of heating. For example, in some embodiments, heating the layer comprises heating the layer at the low-temperature step for a time of from 0.1 to 2 hr, at the first elevated temperature for a time of from 0.5 to 2 hr, and/or at the second elevated temperature at a time of from 2 to 4 hr. In general, the entire time of heating is typically from 1 min to 10 hr. In certain embodiments, the entire time of heating is from 1 to 15, alternatively from 2 to 10, alternatively from 2 to 8, alternatively from 2 to 6, alternatively from 2 to 4, hr.

The layer may be heated under ambient atmospheric conditions, or under non-ambient atmospheric conditions. For example, in certain embodiments, the layer is heated in the presence of an oxidation agent (e.g. oxygen, water), such as under an oxygen-enriched atmosphere. In these or other embodiments, the layer may be heated in the presence of steam (i.e., steaming water).

The film preparation method may be utilized to form films having a wide variety of thicknesses. For instance, the film may have a thickness of a few nanometers or a thickness of a few microns, or a greater or lesser thickness (or a thickness falling between these values). Typically, the thickness of the film is selected based on various parameters, e.g. a desired end use of the film. Accordingly, the preparation method may comprise forming the film to any thickness on the substrate. For example, in certain embodiments, the film is formed on the substrate to a thickness of from 0.1 nanometers (nm) to 1 micrometer (μm). In particular embodiments, the silicone film formed on the substrate has an average thickness of from 1 to 1000, alternatively from 10 to 800, alternatively from 100 to 600, nm. The silicone film thickness may be uniform or may vary.

Ambient moisture and water may contribute to further hydrolysis and/or condensation of T units within the silicone resin to give Q units. In certain embodiments, after the heating steps described above, the dried film may be exposed to ambient conditions and relative humidity.

The present disclosure also provides the film formed in accordance with the film preparation method described above.

The film may be bonded to the substrate (physically and/or chemically), or the film may be peelable or otherwise removable from the substrate. Moreover, the film has excellent physical properties, particularly as compared to conventional spin-on-glass (SOG) films. For example, many conventional SOG films are brittle with poor thermal stability. However, the inventive film has substantial resistance to cracking and etching, and excellent thermal stability at elevated temperatures. For example, in certain embodiments, the film substantially resists cracking when heated to an elevated temperature of i) from 100 to 1000° C.; ii) from 400 to 850° C.; or iii) both i) and ii).

In certain instances, substantial resistance to cracking means that when visually inspected under an optical and/or scanning electronic microscope, the films do not exhibit cracking at a thickness of 1.5 micrometers (μm) when heated at 500° C. for 60 minutes under nitrogen.

In various embodiments, the film is subjected to further processing depending upon a desired end use application. For example, the film may be subjected to oxide deposition (e.g. $SiO_2$ deposition), resist deposition and patterning, etching, chemical or plasma stripping, metallization, or metal deposition. Such further processing techniques are generally known, and often involve etch patterning, for which the film is well suited in view of the film comprising excellent etch selectivity for patterning. Such deposition may be chemical vapor deposition (including low-pressure chemical vapor deposition, plasma-enhanced chemical vapor deposition, and plasma-assisted chemical vapor deposition), physical vapor deposition, or other vacuum deposition techniques. Many such further processing techniques involve elevated temperatures, particularly vacuum deposition, for which the film is well suited in view of the film comprising excellent thermal stability.

The film has excellent dielectric properties and thus may be used to insulate any one or more component of a device (e.g. an electronic device) from heat and/or electric current. For example, the film may be used to insulate the any one or more component of the device from heat attributable to an environment or ambient condition in which the device is utilized. The insulating properties of the film typically extend to both insulating from heat and to insulation from electrical current. As such, the film may also be used to insulate the any one or more component of the device from heat attributable to a use and/or a powering of the device, which generally result in the generation of heat in various electrical components of powered devices (e.g. electrically conductive components).

As such, the present disclosure also provides an electronic device. The electronic device comprises a component, and the film disposed adjacent the component. The electronic device is not limited and, in some instances, may be further defined as a "microelectronic device" and/or an "electronic circuit." Examples of electronic device include silicon based devices, gallium arsenide devices, focal plane arrays, opto-electronic devices, photovoltaic cells, optical devices, dielectric layers, doped dielectric layers to produce transistor-like devices, pigment loaded binder systems containing silicon to produce capacitors and capacitor-like devices, multilayer devices, 3-D devices, silicon-on-insulator (SOI) devices, super lattice devices and the like.

The component may be any component of the electrical device. By "adjacent," it is meant that the film is disposed adjacent and in contact with, alternatively adjacent but separated from, the electronic component. Typically, the substrate on which the film is formed is the component of the electronic device. In such cases, the film is typically a spin-on-glass film comprising silica and/or a dielectric film. However, as the film may be peelable from the substrate, as described above, the component may be distinct from the substrate. In such cases, the electronic device may, but is not required to, further comprise the substrate.

In some instances, the film is used to insulate an electronic component of the device and is heated to a temperature of from greater than ambient to 1,000° C. In such instances, the film insulates the electronic component at the temperature, while exhibiting substantial resistance to cracking. The electronic component may be further defined as a semiconducting and/or a conducting component. In some embodiments, the electronic component is a silicon nitride layer. In such embodiments, the film formed in accordance with the preparation method is a dielectric layer disposed on the silicon nitride layer.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, different, special, and/or unexpected results may be obtained from each member of the respective Markush group independent from all other Markush members. Each member of a Markush group may be relied upon individually and or in combination and provides adequate support for specific embodiments within the scope of the appended claims.

Further, any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The following examples are intended to illustrate the invention and are not to be viewed in any way as limiting to the scope of the invention.

EXAMPLES

Example 1: General Template Hydrolysis Procedure

Synthesis:
A system is assembled by equipping a dried flask (1 L; 4-necked) with a mechanical stirrer, a water condenser, a thermometer, and an addition funnel capped with a rubber stopper under Nitrogen. The system is purged with $N_2$ and kept under a $N_2$ blanket for the remainder of the procedure. Sulfuric acid (101%; 212 g) and oleum (20%; 8 g) are added to the flask via syringe (glass/polypropylene) under $N_2$ blanket, and the flask is heated to and held at 40° C. Toluene (107 g) is then added to the flask via the addition funnel while the contents of the flask are stirred under $N_2$ and maintained at a temperature under 70° C. (maintained via rate of toluene addition) to form a mixture. The mixture is stirred at a temperature of 60-70° C. for 1 hour, cooled to 25° C., and then charged with an addition of toluene (145 g) to form a bi-phasic mixture with a top organic phase and a bottom acid phase. A combination of a precursor compound and a silane compound in toluene (165 g) is then added to the flask dropwise via the addition funnel at 18-25° C. under $N_2$ and with stirring to form a reaction mixture. The reaction mixture is stirred at room temperature for a time (4 to 20 hour), and then transferred to a separation funnel. The acid phase (bottom) is removed, and the remaining organic phase (top) is washed with DI water until reaching a pH of 5-6 (e.g. 6-7×100 mL). During this washing, an organic solvent (e.g. methyl isobutyl ketone (MIBK)) is added to the organic phase as needed to induce phase separation. The organic phase is then dried over $Na_2SO_4$ anhydrous overnight and then filtered to give a filtrate. The filtrate is concentrated in vacuo (e.g. via Rotavapor), and solvent exchanged with a vehicle (e.g. MIBK) to give a composition comprising a vehicle and a silicone resin according to the present disclosure.

GPC:
A gel permeation chromatograph ("GPC"; Viscotek GPC Max) is equipped with a differential refractometer, an online differential pressure viscometer, and a light scattering detector set to 35° C. The GPC is further equipped with mixed-pore columns ([2× Agilent PLgel MIXED-C, 300×7.5 mm, 5 μm; 1× Agilent PLgel MIXED, 7.5×50 mm, 5 μm, guard) set to 35° C. A mobile phase (THF, cert. grade) is provided to the GPC at a flow rate (1.0 ml/min), and the GPC is programmed to a run time (30 min).

A sample of the composition comprising the silicone resin is prepared in electronic grade MIBK to a 10-13 wt % concentration of the silicone resin. A volume (100 μl) of the sample is filtered through a PTFE syringe filter (0.45 um) and then injected into the GPC. The sample is then electronically analyzed (Viscotek Omnisec software, 4.6.2) against a relative calibration curve (polystyrene standards, 580-2,320,000 $M_W$) to determine a $M_W$ of the silicone resin in the composition.

Example 2: HSQ-DS Copolymer Resin 1

A composition comprising a vehicle (MIBK) and a first silicone resin (27,000 $M_W$ HSQ-DS copolymer resin as a 20 wt. % solution in the MIBK; 43 g; 74%) is formed according to the General Template Hydrolysis Procedure above, where:
the precursor compound is trichlorosilane (28.5 g);
the silane is hexaethoxydisilane (1.5 g); and
T is 20 hr.

Example 3: HSQ-DS Copolymer Resin 2

A composition comprising a vehicle (MIBK) and a second silicone resin (HSQ-DS copolymer resin as a solution in the MIBK; 81%) is formed according to the General Template Hydrolysis Procedure above, where:
the precursor compound is trichlorosilane (29.4 g);
the silane is hexaethoxydisilane (0.6 g); and
T is 20 hr.

The second silicone resin has a $M_W$ of 20000 and a silane (DS) content of 2 wt. %.

Example 4: HSQ-DS Copolymer Resin 3

A composition comprising a vehicle (MIBK) and a third silicone resin (HSQ-DS copolymer resin as a solution in the MIBK; 43 g; 80%) is formed according to the General Template Hydrolysis Procedure above, where:
the precursor compound is trichlorosilane (28.5 g);
the silane is hexaethoxydisilane (1.5 g); and
T is 20 hr.

The third silicone resin has a $M_W$ of 23000 and a silane (DS) content of 5 wt. %.

Example 5: HSQ-DS Copolymer Resin 4

A composition comprising a vehicle (MIBK) and a fourth silicone resin (HSQ-DS copolymer resin as a solution in the MIBK; 43 g; 54%) is formed according to the General Template Hydrolysis Procedure above, where:
the precursor compound is trichlorosilane (27.6 g);
the silane is hexaethoxydisilane (2.4 g); and
T is 20 hr.

The fourth silicone resin has a $M_W$ of 28000 and a silane (DS) content of 8 wt. %.

Example 6: HSQ-TS Copolymer Resin (i) Synthesis of Octaethoxytrisilane (OEOTS)
Dry ethanol (56 g; 200 proof) is added into a dried flask (250 mL; 3-necked), which is equipped with a magnetic stir bar and a dropping funnel capped with a rubber stopper, under $N_2$. The system is purged with $N_2$ and kept under a $N_2$ blanket for the remainder of the procedure. A mixture of octachlorotrisilane (8 g) and dry toluene (35 mL) is then added to the flask dropwise with stirring at room temperature, and the contents of the flask is stirred for 30 hours. The contents of the flask are then concentrated in vacuo (via Rotavapor; 1 hour at 80° C. and 5 mmHg) to give octaethoxytrisilane (OEOTS) (9.1 g; 94%).

(ii) Synthesis of HSQ-TS

A composition comprising a vehicle (MIBK) and a fifth silicone resin (HSQ-TS copolymer resin as a 22 wt. % solution in the MIBK; 30 g; 56%) is formed according to the General Template Hydrolysis Procedure above, where:

the precursor compound is trichlorosilane (28.5 g);

the silane is the OEOTS prepared in Example 6(i) above (1.5 g); and

T is 20 hr.

The fifth silicone resin has a $M_W$ of ~25000 and a silane (TS) content of 5%.

Comparative Example 1: HSQ-DMDS Copolymer Resin

A composition comprising a vehicle (MIBK) and a silicone resin (HSQ-DMDS resin as a 13.5 wt. % solution in the MIBK; 20 g; 93%) is formed according to the General Template Hydrolysis Procedure of Example 1 above, where:

the precursor compound is trichlorosilane (5.6 g);

the silane is dimethyltetrachlorodisilane (1.4 g); and

T is 20 hr.

Comparative Example 2: HSQ Polymer Resin

A composition comprising a vehicle (MIBK) and a silicone resin (HSQ resin as a 20 wt % solution in MIBK; 20 g) is formed according to the General Template Hydrolysis Procedure of Example 1 above, where:

the precursor compound is trichlorosilane;

no silane compound is used; and

T is 20 hr.

Example 7: General Film Forming Procedure

Film Formation

A composition comprising a vehicle (MIBK) and a silicone resin (as a 15-22 NVC % solution in the MIBK) is applied (spin coated at 1000 to 1600 RPM) on a substrate (silicon wafer) using a spincoater (e.g. from Headway Research Inc.) to give a layer. The layer is then heated under gas (air or nitrogen) using a temperature ramp (150° C. for 1 hr, 400° C. for 1 hr, and then 600° C. for 3 hr) to give a film.

Film Shrinkage

A spectroscopic ellipsometer (e.g. EC-400 from J.A. Woolam Co., Inc) is used to measure a thickness of the film formed on the substrate according to the film formation procedure, both (1) after the 150° C. heating and before the 400° C. heating ($ft_0$); and also (2) after the 600 heating ($ft_1$). A degree of film shrinkage (percent decrease in thickness) is calculated according to the relationship: Shrinkage=($ft_0$−$ft_1$)/$ft_0$.

Wet Etching Rate (WER)

The spectroscopic ellipsometer is used to measure a thickness ($ft_1$; Å) of the film formed on the substrate according to the film formation procedure. A fresh etchant (1% HF sol. (aq.)) is prepared (e.g. by diluting a 48-50% HF sol. (aq.) with deionized (DI) water) in a plastic container. The substrate (and thus the film) is immersed into the fresh etchant in the plastic container, which is then shaken (e.g. up-to down ca. 30×/min) for a time $T_1$ (min). The substrate (and thus the film) is then removed from etchant, rinsed with DI water, and dried in air to give an etched film on the substrate. The spectroscopic ellipsometer is used to measure a thickness ($ft_2$; Å) of the etched film. A WER value is then calculated according to the difference between $ft_1$ and $ft_2$ over $T_1$ (i.e., the amount thickness loss Å/min before and after etching).

Example 8: Films 1-5

Five films (Films 1-5) are prepared and analyzed according to the General Film Formation Procedure of Example 7. The results of the analyses are shown in Table 1 below:

TABLE 1

| Film | Silane Content | Quality | Shrinkage (1 hr 400° C.- 3 hr 600° C.) | WER (Å/min surface) | WER (Å/min bulky) |
|---|---|---|---|---|---|
| Film 1 | 2% (DS) | Smooth, uniform, no crack after 600° C. aging | 26.8% | 135 | 123 |
| Film 2 | 5% (DS) | Smooth, uniform, no crack after 600° C. aging | 25.8% | 115 | 104 |
| Film 3 | 8% (DS) | Smooth, uniform, no crack after 600° C. aging | 23.6% | 127 | 114 |
| Film 4 | 5% (TS) | Smooth, uniform, no crack after 600° C. aging | ~21% | 153 | 128 |
| Film 5 (comparative) | 20% (DS) | Smooth, uniform, crack after 1 hr 600° C. aging | 27.6% | 198 | |
| Film 6 (comparative) | 0% (DS) | Smooth, uniform, no crack after 600° C. aging | ~25% | 160 | 146 | where:

Film 1 is formed according to the General Film Formation Procedure of Example 7 above using the composition of Example 3;

Film 2 is formed according to the General Film Formation Procedure of Example 7 above, where the composition is the composition of Example 4;

Film 3 is formed according to the General Film Formation Procedure of Example 7 above, where the composition is the composition of Example 5; and Film 4 is formed according to the General Film Formation Procedure of Example 7 above, where the composition is the composition of Example 6;

Film 5 (comparative) is formed according to the General Film Formation Procedure of Example 7 above, where the composition is the composition of Comparative Example 1; and Film 6 (comparative) is formed according to the General Film Formation Procedure of Example 7 above, where the composition is the composition of Comparative Example 2.

The data shown in Table 1 clearly indicates the advantages of the silicone resin, the film preparation method, and the film formed therefrom, over conventional films prepared by conventional methods. These advantages are (i) much less film shrinkage, (ii) much lower WER values, and (iii) better film quality and higher capability of crack resistance.

The invention has been described in an illustrative manner, and it is to be understood that the terminology which has been used is intended to be in the nature of words of description rather than of limitation. Obviously, many modifications and variations of the present invention are possible in light of the above teachings. The invention may be practiced otherwise than as specifically described.

What is claimed is:

1. A silicone resin having the following general formula (I):

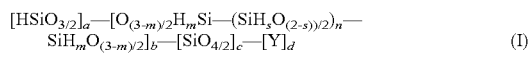

wherein each Y is a polysilane moiety having from 2 to 5 Si atoms; wherein $0<a<1$; $0\leq b\leq 0.2$; $0\leq c\leq 0.2$; and $0\leq d\leq 0.2$; with the proviso that $b+d>0$; $a+b+c+d=1$; m is independently 0, 1 or 2; s is independently 0, 1 or 2; and n is an integer from 0 to 3; and wherein said silicone resin is free from carbon atoms.

2. The silicone resin of claim 1, wherein s and d are each 0 such that said silicone resin has the following general formula (II):

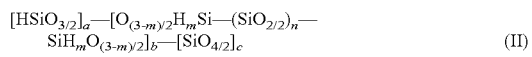

wherein a, b, c, m, and n are defined above.

3. The silicone resin of claim 1, wherein the silicon atoms of the moiety indicated by subscript b are bonded directly to one another.

4. A method of preparing the silicone resin of claim 1, said method comprising:
reacting a silane compound and a precursor compound, thereby preparing the silicone resin;
wherein the silane compound has at least one of the formulas: (i) $X_3Si(SiX_2)_{n'}SiX_3$, (ii) $[Si(X_2)]_{n''}$, and (iii) $(Y')_n(X)_{3-n}Si-Si(Y')_{3-m}(X)_m$;
wherein the precursor compound has the formula $HSiX'_3$;
wherein each Y' has the formula $SiX_3$;
wherein each X and each X' is an independently selected silicon-bonded hydrolysable group; and
wherein n' is an integer from 0 to 3, n'' is an integer from 3 to 5, and m' is an integer from 0 to 3; with the proviso that when the silane compound has formula (iii), n'+m' is 1, 2, or 3.

5. The method of claim 4, wherein the silicon-bonded hydrolysable groups represented by X and X' are independently selected from H, a halide group, an alkoxy group, an alkylamino group, a carboxy group, an alkyliminoxy group, an alkenyloxy group, or an N-alkylamido group.

6. The method of claim 4, wherein: (i) each X is an alkoxy group; (ii) each X' is a halide group; or (iii) both (i) and (ii).

7. The method of claim 6, wherein each X is an ethoxy group; and wherein each X' is Cl.

8. The method of claim 4, wherein: (i) the silane compound is utilized in an amount of from greater than 0 to 20 wt. % based on the combined weight of the silane compound and the precursor compound; (ii) reacting is carried out in the presence of a catalyst; or (iii) both (i) and (ii).

9. The method of claim 4, wherein reacting forms a reaction product comprising the silicone resin, and wherein the method further comprises isolating the silicone resin from the reaction product.

10. A composition comprising:
a silicone resin; and
a vehicle;
wherein the silicone resin is the silicone resin of claim 1.

11. A method of forming a film, said method comprising:
applying a composition on a substrate to give a layer; and
heating the layer to give the film;
wherein the composition is the composition of claim 10.

12. The method of claim 11, wherein the film is further defined as a spin-on-glass film comprising silica.

13. The method of claim 11, wherein the substrate comprises a component of an electronic device, and wherein the film is further defied as a dielectric film.

* * * * *